(12) United States Patent
Hata

(10) Patent No.: US 7,892,873 B2
(45) Date of Patent: Feb. 22, 2011

(54) FABRICATION METHOD OF NITRIDE-BASED SEMICONDUCTOR DEVICE

(75) Inventor: Toshio Hata, Mihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 0 days.

(21) Appl. No.: 11/928,693

(22) Filed: Oct. 30, 2007

(65) Prior Publication Data

US 2008/0182384 A1 Jul. 31, 2008

(30) Foreign Application Priority Data

Nov. 1, 2006 (JP) ............................. 2006-297329

(51) Int. Cl.
*H01L 21/00* (2006.01)
(52) U.S. Cl. ........................ 438/46; 438/455; 438/458
(58) Field of Classification Search ................. 438/22, 438/28, 29, 31, 33, 46, 47, 455, 458, 459
See application file for complete search history.

(56) References Cited

U.S. PATENT DOCUMENTS

| | | | |
|---|---|---|---|
| 4,605,942 | A | 8/1986 | Camlibel et al. |
| 6,169,294 | B1 | 1/2001 | Biing-Jye et al. |
| 6,177,352 | B1 | 1/2001 | Schonfeld et al. |
| 6,197,609 | B1 | 3/2001 | Tsutsui et al. |
| 6,201,264 | B1 | 3/2001 | Khare et al. |
| 6,320,206 | B1 | 11/2001 | Coman et al. |
| 6,441,403 | B1 | 8/2002 | Chang et al. |
| 6,448,102 | B1 | 9/2002 | Kneissl et al. |
| 6,495,862 | B1 | 12/2002 | Okazaki et al. |
| 6,555,847 | B2 | 4/2003 | Hata et al. |
| 6,562,648 | B1 | 5/2003 | Wong et al. |
| 6,573,537 | B1 | 6/2003 | Steigerwald et al. |

(Continued)

FOREIGN PATENT DOCUMENTS

JP 09-008403 A 1/1997

(Continued)

OTHER PUBLICATIONS

Wolf, Stanley and Richard Tauber, Silicon Processing for the VLSI Era, 2000, Lattice Press, Second Edition, vol. 1, pp. 666-667, 678, 681.*

(Continued)

*Primary Examiner*—Matthew C Landau
*Assistant Examiner*—Jessica Hall
(74) *Attorney, Agent, or Firm*—Morrison & Foerster LLP

(57) ABSTRACT

A fabrication method of a nitride-based semiconductor device includes the steps of forming a stacked structure constituted of a nitride-based semiconductor on a support substrate, depositing a first bonding metal on the stacked structure, depositing a second bonding metal on a retention substrate, bonding the first bonding metal and the second bonding metal in a state where the first bonding metal and the second bonding metal face each other to unite the retention substrate and the stacked structure, wherein the first bonding metal and the second bonding metal constitute the bonding metal, and separating the support substrate from the stacked structure for removal. The area of the surface of the retention substrate is set smaller than the area of the surface of the support substrate. Accordingly, cracking, fracture, chipping, and the like at the retention substrate can be prevented.

10 Claims, 4 Drawing Sheets

U.S. PATENT DOCUMENTS

| | | |
|---|---|---|
| 6,613,461 B1 | 9/2003 | Sugahara |
| 6,689,491 B1 | 2/2004 | Nii et al. |
| 6,723,165 B2 * | 4/2004 | Ogawa et al. ................. 117/95 |
| 6,727,518 B2 | 4/2004 | Uemura et al. |
| 6,800,500 B2 | 10/2004 | Coman et al. |
| 6,967,117 B2 | 11/2005 | Horng et al. |
| 7,019,323 B2 | 3/2006 | Shakuda et al. |
| 7,439,160 B2 * | 10/2008 | Le Vaillant et al. .......... 438/459 |
| 2002/0134987 A1 | 9/2002 | Takaoka |
| 2003/0218179 A1 | 11/2003 | Koide et al. |
| 2004/0072383 A1 | 4/2004 | Nagahama et al. |
| 2005/0104081 A1 | 5/2005 | Kim et al. |
| 2005/0199885 A1 | 9/2005 | Hata et al. |
| 2005/0242361 A1 | 11/2005 | Bessho et al. |
| 2006/0006398 A1 | 1/2006 | Hata |
| 2006/0017060 A1 | 1/2006 | Chen et al. |
| 2006/0043387 A1 | 3/2006 | Hata |
| 2006/0043405 A1 | 3/2006 | Hata |
| 2006/0046328 A1 | 3/2006 | Raffetto et al. |
| 2006/0145159 A1 | 7/2006 | Yokoyama et al. |
| 2006/0151801 A1 | 7/2006 | Doan et al. |
| 2006/0202227 A1 | 9/2006 | Kim et al. |
| 2006/0226434 A1 | 10/2006 | Hata |
| 2006/0231852 A1 | 10/2006 | Kususe et al. |
| 2007/0001186 A1 | 1/2007 | Murai et al. |
| 2007/0102692 A1 | 5/2007 | Asahara et al. |
| 2008/0230904 A1 | 9/2008 | Lee |

FOREIGN PATENT DOCUMENTS

| | | |
|---|---|---|
| JP | 2000-252224 | 9/2000 |
| JP | 2003-347587 | 12/2003 |
| JP | 2004-72052 | 3/2004 |
| JP | 2004-266240 A | 9/2004 |
| JP | 2005-311034 | 11/2005 |
| JP | 2006-49871 | 2/2006 |
| JP | 2006-73619 | 3/2006 |
| JP | 2006-73822 | 3/2006 |

OTHER PUBLICATIONS

U.S. Office Action dated Feb. 23, 2007, directed to related U.S. Appl. No. 11/178,201.

U.S. Office Action dated Apr. 18, 2007, directed to related U.S. Appl. No. 11/216,547.

U.S. Office Action dated Jul. 30, 2007, directed to related U.S. Appl. No. 11/219,139.

U.S. Office Action dated Jan. 23, 2008 directed to related U.S. Appl. No. 11/178,201.

U.S. Office Action mailed Feb. 22, 2008, directed to related U.S. Appl. No. 11/219,139. 12 pages.

U.S. Office Action mailed Mar. 18, 2008, directed to related U.S. Appl. No. 11/403,511. (6 pages).

U.S. Office Action, mailed Jun. 11, 2008, directed to related U.S. Appl. No. 11/219,139. 13 pages.

U.S. Office Action mailed on Sep. 25, 2008, directed towards U.S. Appl. No. 11/403,511; 5 pages.

U.S. Office Action mailed on Dec. 10, 2008, directed towards U.S. Appl. No. 11/219,139; 10 pages.

Hata et al., U.S. Office Action mailed on Apr. 13, 2009, directed towards related U.S. Appl. No. 11/403,511; 5 pages.

Hata, U.S. Office Action mailed on Jul. 21, 2009, directed towards related U.S. Appl. No. 11/403,511; (3 pages).

Hata, U.S. Office Action mailed Mar. 30, 2010, directed to related U.S. Appl. No. 11/892,935; 15 pages.

Hata, T., U.S. Office Action mailed Oct. 5, 2010 directed to U.S. Appl. No. 11/892,935; 14 pages.

* cited by examiner

FABRICATION METHOD OF NITRIDE-BASED SEMICONDUCTOR DEVICE

This nonprovisional application claims priority under 35 USC 119 from Japanese Patent Application No. 2006-297329, filed Nov. 1, 2006, the entire contents of which are hereby incorporated by reference.

BACKGROUND OF THE INVENTION

1. Field of the Invention

The present invention relates to a fabrication method of a nitride-based semiconductor device, particularly a fabrication method of a nitride-based semiconductor device, removing a support substrate on which a nitride-based semiconductor layer is formed after bonding between the nitride-based semiconductor layer and a retention substrate.

2. Description of the Background Art

A nitride-based semiconductor device typically employs a nitride-based compound semiconductor for the major portion of the device structure. Various devices such as a light emitting device, a light receiving device and a power device can be enumerated. In the case of a light emitting device such as an LED (Light Emitting Diode) or LD (Laser Diode), light emission corresponding to the wavelength range from ultraviolet to infrared can be obtained by appropriately selecting the composition of the nitride-based compound semiconductor employed in the light emitting layer.

A nitride-based compound semiconductor is, for example, a group III nitride determined by the compositional formula of $Al_a In_b Ga_{1-a-b} N$ ($0 \leq a \leq 1$, $0 \leq b \leq 1$, $0 \leq a+b \leq 1$). Specific examples such as GaN, InGaN, AlGaN, AlInGaN, AlN, InN and the like, having an arbitrary composition, can be enumerated.

In the fabrication of a nitride-based semiconductor device, a semiconductor wafer is taken as the chip. The formation of a device structure includes the steps of depositing a nitride-based semiconductor layer on a support substrate that is a sapphire substrate or the like, and forming a P type ohmic electrode and an N type ohmic electrode on the nitride-based semiconductor layer to obtain a device (chip). However, this device structure is disadvantageous in that the electrodes occupy a relatively large area since two electrodes are formed on the nitride-based semiconductor layer, leading to the problem that the number of chips formed from one wafer is low.

In order to form many chips from one wafer, one conventional approach is to separate the wafer, after formation of a semiconductor layer thereon, from the semiconductor layer, and use the wafer again (Japanese Patent Laying-Open No. 2000-252224). FIG. 3 is a schematic sectional view to describe a conventional fabrication method of a nitride-based semiconductor device. Referring to FIG. 3, the conventional fabrication method includes the steps of depositing a stacked structure 27 constituted of a nitride-based semiconductor on a support substrate 2, bonding or attaching stacked structure 27 to a retention substrate 21 using a bonding metal 23, and working on the nitride-based semiconductor and retention substrate to produce a nitride-based semiconductor device.

The inventor of the present invention found, through evaluation experiments, that the conventional bonding method (the attaching method) had problems set forth below. When a support substrate with a stacked structure constituted of a nitride-based semiconductor is bonded to a retention substrate (attached together), followed by removal of the support substrate, cracking, fracture, chipping, and the like will occur at the retention substrate during removal of the support substrate. It is considered that placing a pair of forceps or the like during removal of the support substrate will cause cracking, fracture, chipping and the like at the retention substrate due to its weak strength.

SUMMARY OF THE INVENTION

In view of the foregoing, an object of the present invention is to provide a fabrication method of a nitride-based semiconductor device that can prevent occurrence of cracking, fracture, chipping, and the like at the retention substrate, particularly during removal of a support substrate.

The present invention is directed to a fabrication method of a nitride-based semiconductor device including a structure in which a retention substrate and a stacked structure constituted of a nitride-based semiconductor are united with a bonding metal therebetween. The fabrication method includes the steps of forming a stacked structure constituted of a nitride-based semiconductor on a support substrate, depositing a first bonding metal on the stacked structure, depositing a second bonding metal on the retention substrate, bonding the first bonding metal and the second bonding metal in a state where the first bonding metal and the second bonding metal face each other to unite the retention substrate and the stacked structure, wherein the first bonding metal and the second bonding metal constitute the bonding metal, and separating the support substrate from the stacked structure for removal. The area of the surface of the retention substrate corresponding to the second bonding metal deposition side is set smaller than the area of the surface of the support substrate corresponding to the stacked structure formation side.

In the present invention, the bonding metal is preferably made to avoid contact with the support substrate.

In the present invention, the thickness of the support substrate is preferably set to not more than 400 μm. In the step of bonding in the present invention, the retention substrate is preferably united with the stacked structure along the entire area of the surface of the retention substrate corresponding to the second bonding metal deposition side.

In the present invention, removal of the support substrate in the step of removing the support substrate is preferably carried out by applying a laser beam from a backside of the support substrate for separation of the stacked structure and the support substrate.

Preferably, the fabrication method of the present invention further includes the step of mirror-polishing a face of the support substrate to which the laser beam is to be applied, prior to the step of removing the support substrate.

In the step of removing the support substrate, the laser beam is preferably applied with the backside of the support substrate located at the lower side.

In the present invention, the retention substrate preferably is formed of at least one member selected from the group consisting of P-doped or N-doped Si, Ge, Sic and GaP.

In the present invention, following deposition of the first bonding metal on the stacked structure and deposition of the second bonding metal on the retention substrate, the first bonding metal is bonded to the second bonding metal in the step of bonding. Accordingly, favorable bonding can be ensured between the retention substrate and stacked structure to achieve a favorable bonding yield. Furthermore, occurrence of cracking, fracture, chipping, and the like at the retention substrate can be prevented. Since the contact between the support substrate and bonding metal is favorably prevented particularly after the step of bonding by setting the area of the surface of the retention substrate corresponding to the second bonding metal deposition side smaller than the area of the surface of the support substrate corresponding to the stacked structure formation side, any residue of the removed support substrate, as well as warping and peel off of the stacked structure can be suppressed. By the fabrication method of a nitride-based semiconductor device of the present invention, a nitride-based semiconductor device having favorable reliability can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
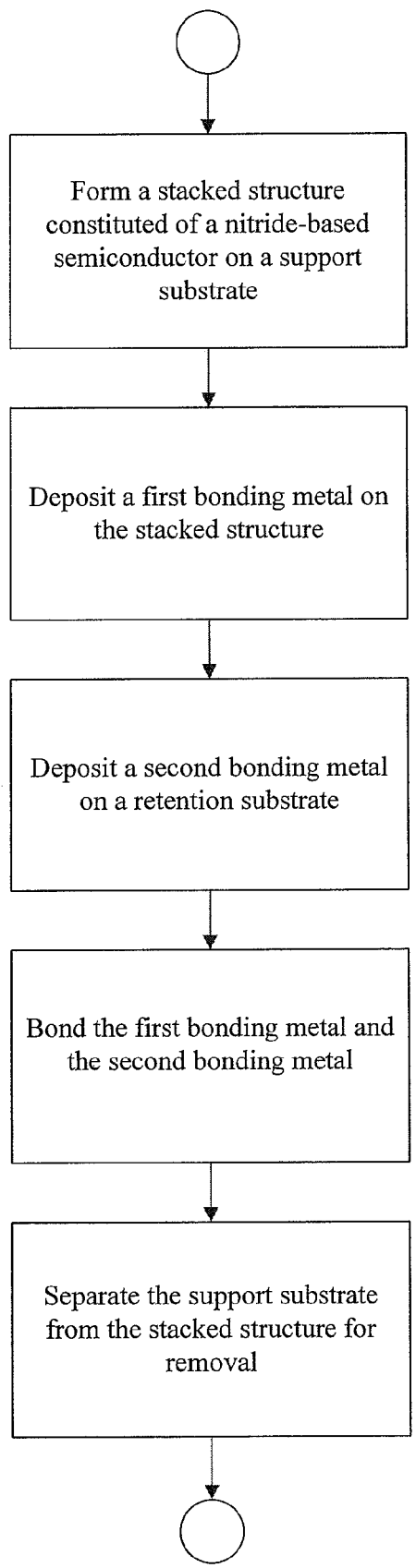
FIG. 4 is a flow chart illustrating an embodiment of a method for fabricating a nitride-based semiconductor device.

The present invention is directed to a fabrication method of a nitride-based semiconductor device including a structure in which a retention substrate and a stacked structure constituted of a nitride-based semiconductor are united with a bonding metal therebetween. As depicted in FIG. 4, the fabrication method may include the steps of forming a stacked structure constituted of a nitride-based semiconductor on a support substrate, depositing a first bonding metal on the stacked structure, depositing a second bonding metal on the retention substrate, bonding the first bonding metal and the second bonding metal facing each other to unite the retention substrate and the stacked structure, wherein the first bonding metal and the second bonding metal constitute the bonding metal, and separating the support substrate from the stacked structure for removal.

Figure 1:
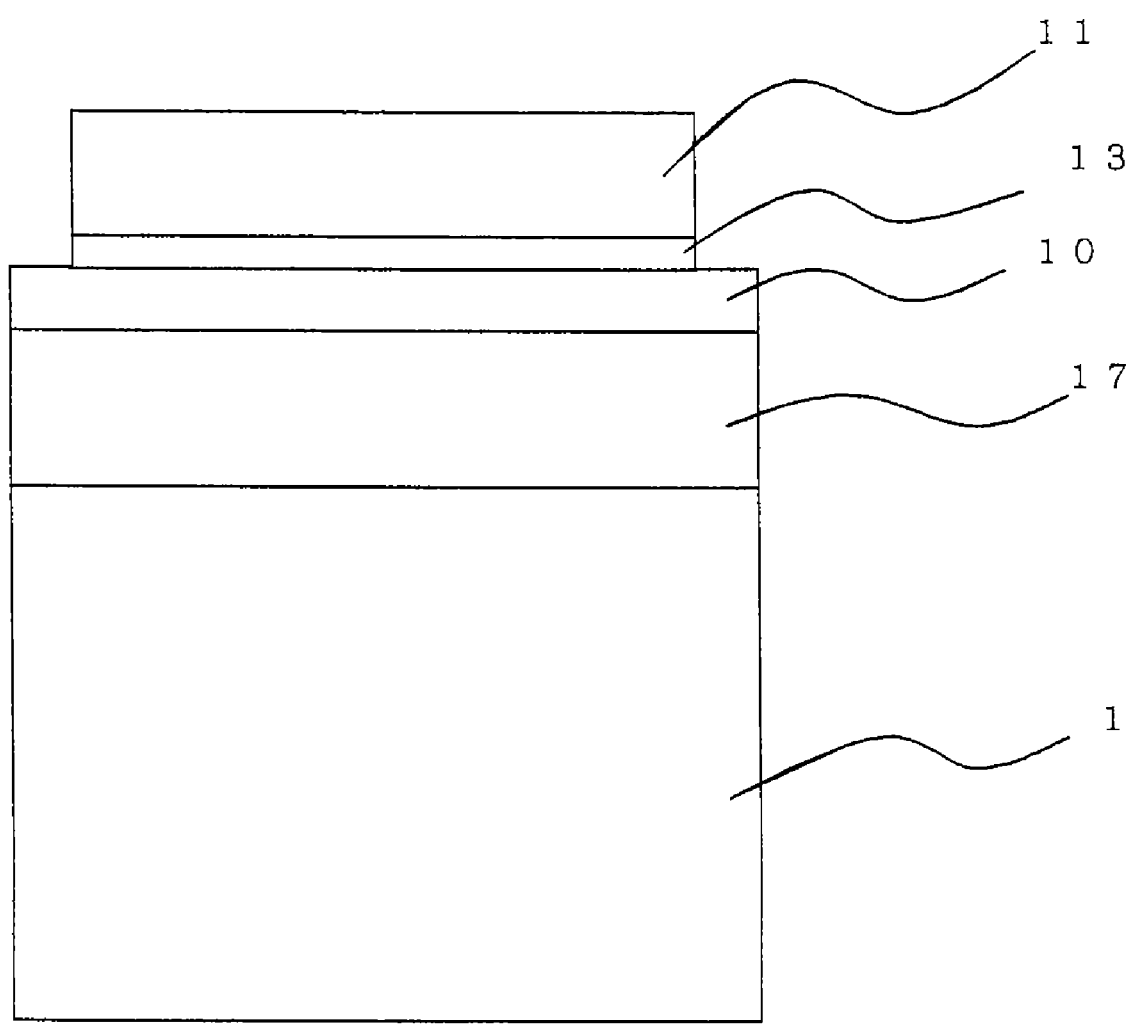
FIG. 1 is a schematic sectional view to describe a state subsequent to a bonding step in a fabrication method of a nitride-based semiconductor device of the present invention.

FIG. 1 represents the state where a retention substrate 11 and a stacked structure 17 are united with a first bonding metal 10 and a second bonding metal 13 therebetween. First bonding metal 10 is deposited on stacked structure 17 located on support substrate 1, and second bonding metal 13 is deposited on retention substrate 11. In FIG. 1, the area of the surface of retention substrate 11 corresponding to the side where second bonding metal 13 is deposited is set smaller than the area of the surface of support substrate 11 corresponding to the side where stacked structure 17 is formed.

Figure 2:
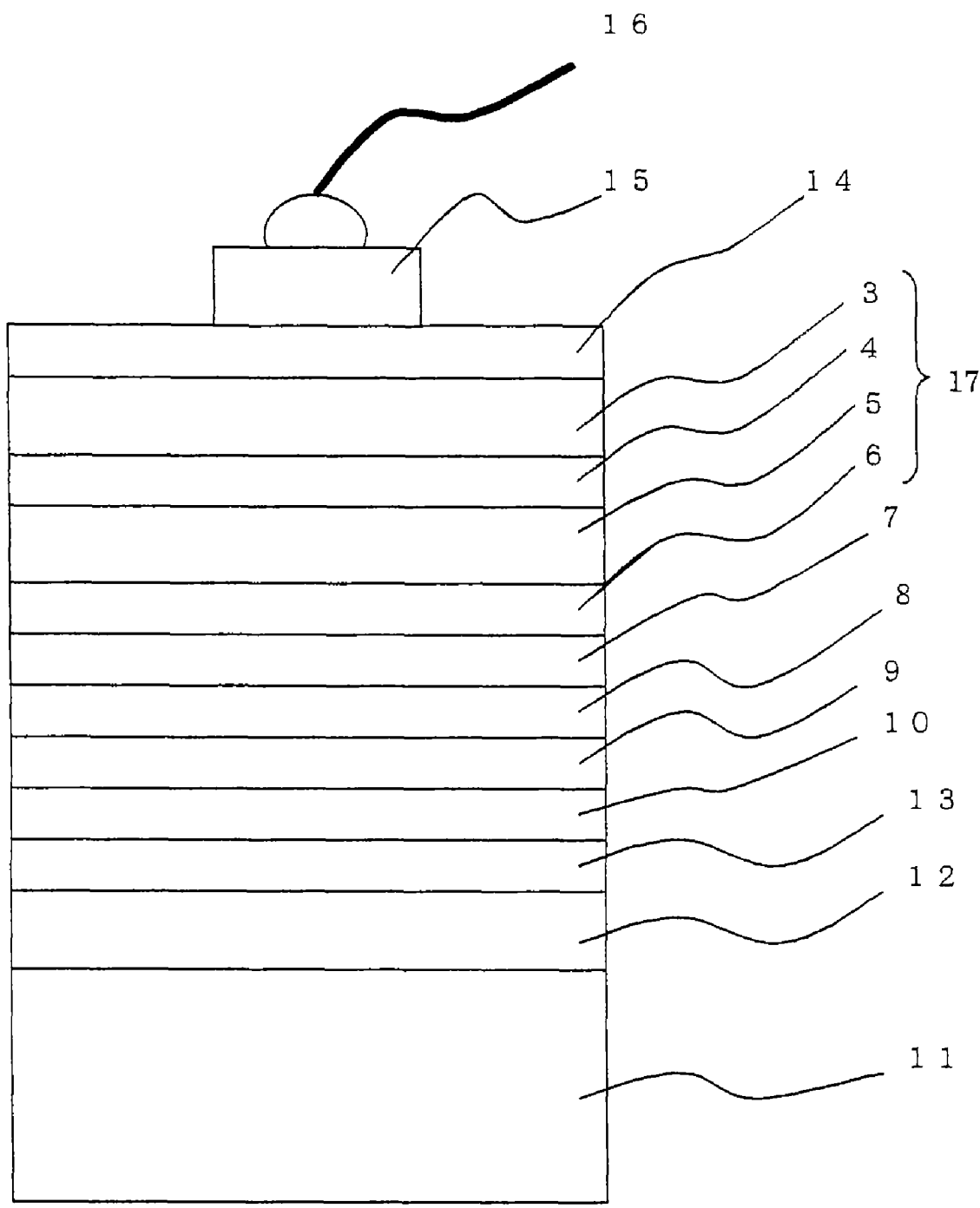
FIG. 2 is a schematic sectional view to describe the main structure of a light emitting device as an example of a nitride-based semiconductor device obtained by the fabrication method of the present invention.
Figure 3:
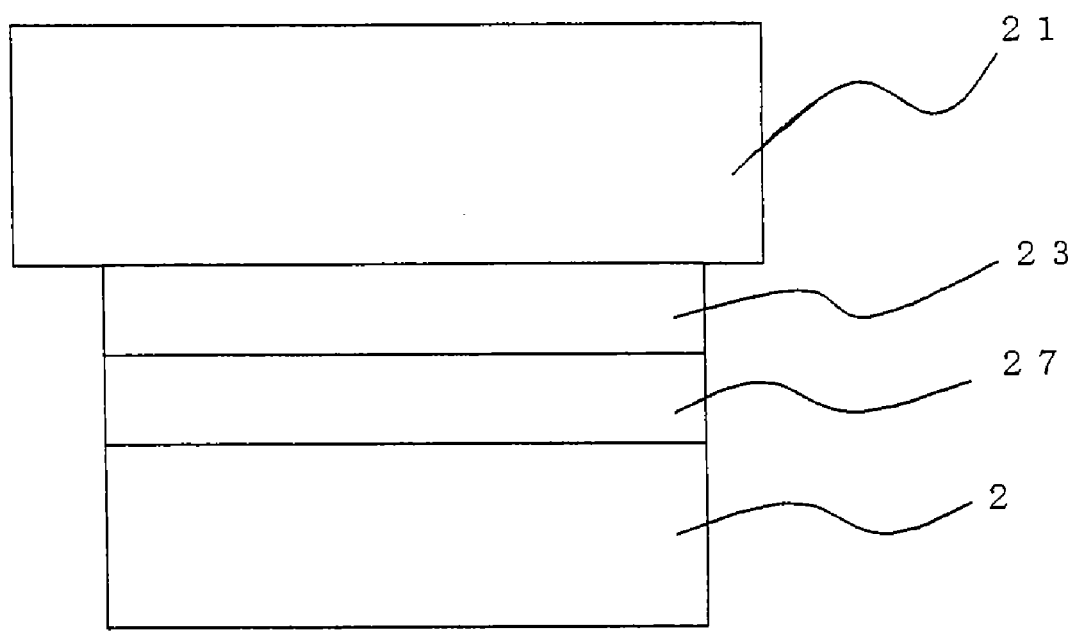
FIG. 3 is a schematic sectional view to describe a conventional fabrication method of a nitride-based semiconductor device.

FIG. 2 represents an example of a nitride-based semiconductor device obtained by the fabrication method of the present invention. On retention substrate 11 are formed an adhesive layer 12, a second bonding metal 13, a first bonding metal 10, a barrier layer 9, a reflection layer 8, an ohmic electrode 7, a P type layer 6, an evaporation block layer 5, a light emitting layer 4, an N type layer 3, a transparent conductor layer 14, and a pad electrode 15. Pad electrode 15 is connected to a wire 16. The stacked structure of N type layer 3, light emitting layer 4, evaporation block layer 5 and P type layer 6 shown in FIG. 2 corresponds to the stacked structure of the present invention, indicated as stacked structure 17 in FIG. 1. In the present invention, other relevant layers may or may not be present between the support substrate and stacked structure, between the stacked structure and bonding metal, and between the retention substrate and bonding metal.

In the present invention, following the bonding metal deposition step of depositing the first bonding metal on the stacked structure and the second bonding metal on the retention substrate, a bonding step is carried out. Specifically, the first bonding metal is bonded with the second bonding metal. The first bonding metal and the second bonding metal constitute the bonding metal located between the retention substrate and the stacked structure. Accordingly, the bonding between the retention substrate and stacked structure is rendered favorable. Occurrence of cracking, fracture, chipping and the like at the retention substrate when the support substrate is separated and removed from the stacked structure in the support substrate removal step can be suppressed.

By setting the area of the surface of the retention substrate corresponding to the side where the second bonding metal is deposited (hereinafter, simply referred to as the surface of the retention substrate) smaller than the area of the surface of the support substrate corresponding to the side where the stacked structure is formed (hereinafter, simply referred to as the surface of the support substrate), contact between the bonding metal and the support substrate, caused by diffusion of the bonding metal to the support substrate, particularly diffusion to the side face of the support substrate, can be prevented favorably. Thus, leaving a residue of the removed support substrate, and/or warping and peel off of the stacked portion can be suppressed.

A typical manner of a fabrication method of a nitride-based semiconductor device according to the present invention will be described hereinafter with reference to FIGS. 1 and 2. It is to be understood that the present invention is not limited thereto.

Stacked Structure Formation Step

In the fabrication method of a nitride-based semiconductor device of the present invention, first a stacked structure constituted of a nitride-based semiconductor is formed on the support substrate in the stacked structure formation step. A sapphire substrate can be cited as an example of the support substrate employed in the present invention. The thickness of the support substrate is preferably set to not more than 400 μm. By such thickness, occurrence of cracking, fracture, chipping and the like at the retention substrate can be suppressed more favorably. The thickness of the support substrate can be adjusted by grinding and polishing using a commercially-available grinder/polishing machine.

For the stacked structure constituted of a nitride-based semiconductor, the well-known structure in a nitride-based semiconductor device is appropriately employed. For example, a support substrate 1 such as a sapphire substrate is placed in an MOCVD device, and raised in temperature to approximately 1100° C. in a hydrogen ambient for thermal etching. Then, the temperature is lowered to approximately 300° C., and trimethyl gallium (hereinafter, also termed TMG) and ammonia, for example, are fed as the group III raw material and the N raw material, respectively, to grow a low-temperature deposited GaN buffer layer of approximately 20 nm, for example, in thickness. Next, the temperature is raised to approximately 1000° C. TMG, ammonia, and $SiH_4$, for example, are fed as the raw material to grow an Si-doped N type GaN layer to approximately 6 μm, for example, as N type layer 3. Following reduction of the temperature to approximately 800° C., TMG, trymethyl indium (TMI), $NH_3$, and $SiH_4$, for example, are fed as the raw material to form a 6-period multiple quantum well active layer including a GaN barrier layer (thickness: 10 nm, for example) and an InGaN well layer (light emitting wavelength: 465 nm; thickness: 3 nm, for example), as light emitting layer 4.

Then, the growth temperature is raised to 1000° C., and TMG, trymethyl alluminum (TMA), $NH_3$, for example, as the raw material, as well as bis-cyclopentadienyl magnesium ($Cp_2Mg$), for example, as the dopant, are fed to sequentially form a P type AlGaN layer of approximately 30 nm in thickness, for example, as evaporation block layer 5, and a P type GaN contact layer of approximately 200 nm in thickness, for example, as P type layer 6. By the procedure set forth above, a semiconductor wafer including a blue color LED structure having a light emitting wavelength of 465 nm, for example, can be produced as the stacked structure of the present invention.

<First Bonding Metal Deposition Step, Second Bonding Metal Deposition Step>

First bonding metal 10 is deposited on the surface of stacked structure 17 obtained as set forth above (first bonding metal deposition step). In addition, second bonding metal 13 is deposited on the surface of retention substrate 11 employed in the present invention (second bonding metal deposition step).

A typical substrate employed as the substrate of a nitride-based semiconductor device is employed as the retention substrate in the present invention. For example, at least one member selected from of the group consisting of P-doped or N-doped Si, Ge, Sic and GaP can be cited for the retention substrate.

For the first bonding metal and second bonding metal employed in the present invention, AuSn, Au, Sn, In, Pd, Al, Ag, Ag-Nd and Ag-Bi can be enumerated as an example. In the case where AuSn is employed, AuSn having an Sn content of approximately 20 wt % is preferable. The first and second bonding metals may have the same or different composition. A typical combination is based on an AuSn alloy including 20 wt % of Sn as the first bonding metal and Au as the second bonding metal.

Specifically, on P type layer 6 of stacked structure 17 obtained in the stacked structure formation step set forth above, first bonding metal 10 of AuSn having a thickness of approximately 3 μm is deposited with ohmic electrode 7 of Pt having a thickness of approximately 2 μm, reflection layer 8 of Ag-Nd having a thickness of approximately 200 nm, and barrier layer 9 of Ni-Ti having a thickness of approximately 100 nm, for example, therebetween (first bonding metal deposition step). Ohmic electrode 7, reflection layer 8, barrier layer 9, and first bonding metal 10 can be deposited by an appropriate method such as vapor deposition. Vapor deposition includes, for example, EB (electronic beam) vapor deposition, resistance heating evaporation, or the like.

On retention substrate 11 constituted of P type Si having a diameter of 48 mm, for example, second bonding metal 13 constituted of Au having a thickness of approximately 1 μm is provided by EB vapor deposition, resistance heating evaporation, or the like, with a Ti layer having a thickness of approximately 50 nm as adhesive layer 12 therebetween (second bonding metal deposition step).

By the process set forth above, first bonding metal and second bonding metal can be deposited on the stacked structure and the retention substrate, respectively.

<Bonding Step>

In the bonding step, retention substrate 11 and stacked structure 17 are united by bonding first bonding metal 10 and second bonding metal 13 in a state where first bonding metal 10 located on stacked structure 17 and second bonding metal 13 located on retention substrate 11 face each other. The bonding process can be effected by establishing contact between first bonding metal 10 and second bonding metal 13 facing each other, and applying eutectic bonding or the like under the conditions of 310° C. in temperature, 300 N/cm² in pressure, and the like.

In the bonding step of the present invention, the retention substrate is preferably united with the stacked structure along the entire area of the surface of the retention substrate corresponding to the second bonding metal deposition side. In this case, the bonding between the retention substrate and the stacked structure is rendered further favorable, whereby the bonding yield is further improved. A nitride-based semiconductor device having higher reliability can be obtained. Specifically, it is preferable to unite the retention substrate and the stacked structure upon positioning therebetween such that the surface of the retention substrate faces the center region of the surface of the stacked structure corresponding to the first bonding metal deposition side.

In the present invention, the bonding metal obtained by bonding the first bonding metal and second bonding metal in the bonding step is preferably made to avoid contact with the support substrate. In other words, it is preferable to unite the retention substrate and the stacked structure under a controlled state where the bonding metal will not come into contact with the support substrate by the bonding metal diffused particularly to the side face of the support substrate. If the bonding metal is diffused particularly to the side face of the support substrate, adhesion between the retention substrate and the support substrate will be established by the bonding metal, leading to the possibility of difficulty in removing the support substrate and/or leaving a residue of the removed support substrate. In addition, occurrence of warping or peel off of the stacked structure may be facilitated.

In order to avoid contact between the bonding metal and the support substrate, it is preferable to set the relationship of the area of the surfaces of the support substrate and retention substrate to the layer thickness of the bonding metal to be within an appropriate range. In the present invention, the area of the surface of the retention substrate is set smaller than the area of the surface of the support substrate. The size of the support substrate and retention substrate and the layer thickness of the bonding metal are selected such that the difference between the span of the support substrate surface and the span of the retention substrate surface is greater than the sum of the layer thickness of the bonding metal located on the retention substrate and stacked structure.

<Support Substrate Removal Step>

In the support substrate removal step, support substrate 1 is separated from stacked structure 17 to be removed. This removal can be effected by applying a laser beam towards support substrate 1 from the backside of support substrate 1, i.e. from the side opposite to the stacked structure formation side, whereby the layer in contact with support substrate 1 among the nitride-based semiconductor constituting stacked structure 17 is partially thermal-decomposed to cause separation between stacked structure 17 and support substrate 1.

When the method set forth above is to be employed, the nitride-based semiconductor layer subjected to thermal decomposition is preferably formed as a buffer layer during the stacked structure formation step. Furthermore, a layer directed to thermal decomposition may be additionally provided between the support substrate and stacked structure.

In the case where the support substrate is removed by applying a laser beam to the support substrate from the backside in the present invention, preferably the fabrication method further includes a mirror polishing step of mirror-polishing the backside face of the support substrate to which the laser beam is to be applied. Mirror-polishing the face to which the laser beam is to be applied is advantageous in that only a low laser power is required to irradiate the support substrate since laser beam scattering at the face to which a laser beam is applied is small. Accordingly, damage to the light emitting layer or the like in stacked structure 17 is reduced.

The laser beam set form above is preferably applied to the entire surface at the backside of the support substrate from the standpoint of favorably separating and removing the support substrate. The mirror-polishing process is preferably carried out uniformly all over the entire surface at the backside of the support substrate, by grinding and/or polishing. The mirrored face at the end of the support substrate is readily rendered uneven. It is therefore preferable to carry out mirror-polishing such that the mirrored state of the entire surface at the backside including the end becomes even by selecting appropriate conditions for grinding and polishing. If the mirrored face at the backside of the support substrate is uneven, radiation of the laser beam will become uneven, leading to the disadvantage that thermal decomposition of the nitride-based semiconductor is insufficient. As a result, it may become difficult to remove the support substrate, and/or a residue of the removed support substrate may remain.

In the case where the support substrate is removed by applying a laser beam from the backside of the support substrate, the laser beam is preferably applied with the backside of the support substrate located at the lower side. This is advantageous in that the support substrate separated from the stacked structure by thermal decomposition of the nitride-based semiconductor can be directly dropped downwards to simplify removal of the support substrate.

<Other Steps>

Following removal of the support substrate as set forth above, the conventional well known operations set forth below may be carried out to produce a nitride-based semiconductor device. RIE (Reactive Ion Etching), for example, is effected from the side of N type layer 3 using a resist mask to completely remove P type layer 6 and form a groove for chip division (dividing line), and then reflection layer 8 is exposed. The width of the groove formed by RIE can be set to approximately 20 μm. Transparent conductor ITO as transparent conductor layer 14 is formed to a thickness of 150 nm, for example, substantially all over the exposed surface of cleaned N type layer 3. An n bonding pad electrode (Au/Cr) is formed thereon as pad electrode 15, and connected with wire 16. Pits and projections can be formed by RME, for example, on the exposed surface of the cleaned N type layer 3, followed by formation of a transparent conductor ITO as transparent conductor layer 14 substantially all over the surface. By the method set forth above, a nitride-based semiconductor device can be obtained.

The nitride-based semiconductor device of the present invention can be used in various devices such as a light emitting device of LED, LD, a light receiving device, a power device, or the like.

The present invention will be described in further detail based on examples in the following. It will be understood that the present invention is not limited thereto.

EXAMPLE 1

In the present example, a GaN based LED corresponding to a structure as shown in FIG. 2 was produced as a nitride-based semiconductor device by the stacked structure formation step, first bonding metal deposition step, second bonding metal deposition step, bonding step, mirror-polishing step, support substrate removal step, and the conventional well-known step.

<Stacked Structure Formation Step>

A C-plane sapphire wafer having a diameter of 50.2 mm and thickness of 430 μm was employed as support substrate 1. Support substrate I was placed in an MOCVD device, raised in temperature up to 1100° C. in a hydrogen ambient for thermal etching.

Next, the temperature was lowered down to 300° C., and trimethyl gallium (TMG) as the group III raw material and ammonia as the N raw material were fed to grow a low-temperature deposited GaN buffer layer having a thickness of 20 nm. Then, the temperature was raised to 1000° C., and trimethyl gallium (TMG), ammonia and $SiH_4$ were fed as the raw material to grow Si-doped N type GaN layer as N type layer 3 up to 6 μm. Then, after the temperature has been lowered to 800° C., TMG, trimethyl indium (TMI), $NH_3$, and $SiH_4$ were fed as the raw material to form a 6-period multiple quantum well active layer including a GaN barrier layer (thickness: 10 nm) and an InGaN well layer (light emitting wavelength: 465 nm; thickness: 3 nm), as light emitting layer 4.

Then, the growth temperature was raised to 1000° C., and TMG, trymethyl alluminum (TMA), and $NH_3$ as the raw material, as well as bis-cyclopentadienyl magnesium ($Cp_2Mg$) as the dopant, were fed to sequentially form a P type AlGaN layer of approximately 30 nm in thickness as evaporation block layer 5, and a P type GaN contact layer of approximately 200 nm in thickness as P type layer 6. Thus, a semiconductor wafer including a blue color LED structure having a light emitting wavelength of 465 nm was produced as stacked structure 17.

<First Bonding Metal Deposition Step>

Following formation of ohmic electrode 7 of Pt having a thickness of 3 nm through EB on the P type GaN contact layer deposited as P type layer 6 on support substrate 1, reflection layer 8 of Ag-Nd having a thickness of 200 nm, and Ni-Ti barrier layer 9 having a thickness of 100 nm were formed by sputtering. First bonding metal 10 constituted of AuSn having a thickness of 3 μm was deposited by resistance heating evaporation. The AuSn alloy employed as first bonding metal 10 contained 20 wt % of Sn.

<Second Bonding Metal Deposition Step>

On P type Si retention substrate having a diameter of 48 mm formed as retention substrate 11, Ti adhesive layer 12 of 50 nm in thickness and second bonding metal 13 of Au having a thickness of 1 μm were formed in this order by EB vaporization.

<Bonding Step>

First bonding metal 10 and second bonding metal 13 deposited as set forth above were brought into contact facing each other, and then subjected to eutectic bonding at the temperature of 310° C. and pressure of 300 N/cm² to establish bonding therebetween.

<Mirror-Polishing Step>

After the backside of support substrate 1 was grinded such that the thickness of support substrate 1 became 400 μm using a commercially-available grinder/polishing machine, the entire backside of support substrate 1, i.e. the face to which a laser beam is applied, was mirror-polished.

<Support Substrate Removal Step>

A YAG-THG (yttrium aluminum garnet third harmonic) laser beam (wavelength: 355 nm) was applied from the mirror-polished surface at the backside of support substrate 1, whereby the GaN buffer layer in contact with support substrate 1 and a portion of N type layer 3 were thermal-decomposed. Accordingly, support substrate 1 was separated to be removed. In other words, the GaN buffer layer was completely removed by thermal decomposition to expose the surface of N type layer 3.

RIE (Reactive Ion Etching) was effected from the side of N type layer 3 using a resist mask to completely remove P type layer 6 and form a groove for chip division (dividing line), and then reflection layer 8 was exposed. The width of the groove formed by RIE was set to approximately 20 μm. Transparent conductor ITO as transparent conductor layer 14 was formed to a thickness of 150 nm substantially all over the exposed surface of cleaned N type layer 3. An n bonding pad electrode (Au/Cr) was formed thereon as pad electrode 15, and connected with wire 16 formed of Au.

By the method set forth above, a nitride-based semiconductor device was obtained.

Upon visual confirmation of the device immediately after the bonding step, no diffusion of the bonding metal at support substrate 1 and at the side face thereof was observed. There was no contact between support substrate 1 and the bonding metal. Furthermore, there was no diffusion of the bonding metal to the side face of stacked structure 17.

In the present example, a wafer having a diameter of approximately 50.2 mm was employed for support substrate 1, and a wafer having a diameter of approximately 48 mm was employed for retention substrate 11. In other words, the difference between the diameter of the support substrate surface and the diameter of the retention substrate surface was approximately 2.2 mm. Since the layer thickness of first bonding metal 10 at the side of support substrate 1 was 3 μm and the layer thickness of second bonding metal 13 at the side of retention substrate 11 was 1 μm, the sum of the layer thickness of first and second bonding metals 10 and 13 was 4 μm. In the present example, the difference between the span of the support substrate surface and the span of the retention substrate surface was set larger than the sum of the thickness of the first and second bonding metals. The bonding metal did not diffuse to the side face of stacked structure 17 having a thickness of approximately 7 μm.

The bonding yield calculated by peel testing for the present example was 100%. It is therefore appreciated that a favorable bonding yield of at least 98%, for example, can be obtained by the fabrication method of a nitride-based semiconductor device of the present invention.

The fabrication method of a nitride-based semiconductor device of the present invention is conveniently applicable to the fabrication of a nitride-based semiconductor device such as a light emitting device, light receiving device, power device, and the like.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A fabrication method of a nitride-based semiconductor device including a structure in which a retention substrate and a stacked structure constituted of a nitride-based semiconductor are united with a bonding metal therebetween, said fabrication method comprising:

forming said stacked structure constituted of said nitride-based semiconductor on a support substrate, depositing a first bonding metal on said stacked structure, depositing a second bonding metal on said retention substrate, bonding said first bonding metal to said second bonding metal in a state where said first bonding metal and said second bonding metal face each other to unite said retention substrate and said stacked structure, said first bonding metal and said second bonding metal constituting said bonding metal, separating said support substrate from said stacked structure for removal, and forming a groove in said stacked structure for chip division after separating said support substrate from said stacked structure, wherein a continuous surface area, before forming the groove for chip division, of the entire surface of said retention substrate disposed on a side of the second bonding metal is smaller than a continuous surface area, before forming the groove for chip division, of the entire surface of said support substrate disposed on a side of the stacked structure, and wherein a difference between a span of the support substrate and a span of the retention substrate is greater than a sum of a layer thickness of said first bonding metal and a layer thickness of said second bonding metal.

2. The fabrication method of a nitride-based semiconductor device according to claim 1, wherein said bonding metal is made to avoid contact with said support substrate.

3. The fabrication method of a nitride-based semiconductor device according to claim 1, wherein said support substrate has a thickness of not more than 400 μm.

4. The fabrication method of a nitride-based semiconductor device according to claim 1, wherein said retention substrate is united with said stacked structure over an entire surface area of a side facing said second bonding metal in said bonding.

5. The fabrication method of a nitride-based semiconductor device according to claim 1, wherein the separating of said support substrate is effected by applying a laser beam from a backside of said support substrate.

6. The fabrication method of a nitride-based semiconductor device according to claim 5, said method further comprising:

mirror-polishing a face of said support substrate to which said laser beam is to be applied, prior to said separating of the support substrate.

7. The fabrication method of a nitride-based semiconductor device according to claim 5, wherein said laser beam is applied with said backside of said support substrate located at a lower side.

8. The fabrication method of a nitride-based semiconductor device according to claim 1, wherein said retention substrate is formed of at least one member selected from the group consisting of P-doped or N-doped Si, Ge, SiC and GaP.

9. The fabrication method of a nitride-based semiconductor device according to claim 8, wherein said support substrate comprises sapphire.

10. The fabrication method of a nitride-based semiconductor device according to claim 8, wherein each side surfaces of the stacked structure of the nitride-based semiconductor device are formed along planes orthogonal to a light emitting layer of the stacked structure.

* * * * *